United States Patent [19]

Finley

[11] Patent Number: 5,417,827
[45] Date of Patent: May 23, 1995

[54] CATHODE TARGETS OF SILICON AND TRANSITION METAL

[75] Inventor: James J. Finley, O'Hara Township, Allegheny County, Pa.

[73] Assignee: PPG Industries, Inc., Pittsburgh, Pa.

[21] Appl. No.: 41,015

[22] Filed: Mar. 31, 1993

Related U.S. Application Data

[63] Continuation-in-part of Ser. No. 981,706, Nov. 25, 1992, which is a continuation-in-part of Ser. No. 799,806, Nov. 29, 1991.

[51] Int. Cl.[6] .............................................. C23C 14/34
[52] U.S. Cl. .......................... 204/192.28; 204/192.15; 204/192.26; 204/192.27; 204/298.13
[58] Field of Search ...................... 204/192.15, 192.22, 204/192.23, 192.26, 192.27, 192.28, 298.13

[56] References Cited

U.S. PATENT DOCUMENTS 4,769,291 9/1988 Belkind et al. ................. 204/192.26
4,990,234 2/1991 Szczyrbowski et al. ........ 204/192.26

*Primary Examiner*—R. Bruce Breneman
*Assistant Examiner*—Rodney G. McDonald
*Attorney, Agent, or Firm*—Donna L. Seidel

[57] ABSTRACT

Silicon-nickel cathode targets comprising 3 to 18 weight percent nickel are disclosed for sputtering low absorbance coatings of silicon-nickel alloy in atmospheres comprising reactive gases such as nitrogen, oxygen and mixtures thereof which may further comprise inert gas such as argon to form nitrides, oxides, and oxynitrides as well as metallic films. The presence of nickel in the cathode target in the range of 3 to 18 weight percent provides target stability and enhanced sputtering rates over targets of silicon alone or alloyed with aluminum, while maintaining a low coating refractive index and low absorbance, not only when sputtering in oxygen to produce an oxide coating, but also when sputtering in nitrogen or a mixture of nitrogen and oxygen to produce coatings of silicon-nickel nitride or oxynitride respectively.

12 Claims, 4 Drawing Sheets

CATHODE TARGETS OF SILICON AND TRANSITION METAL

CROSS-REFERENCE TO RELATED APPLICATION

This application is a continuation-in-part of U.S. application Ser. No. 07/981,706, filed Nov. 25, 1992, by Finley entitled "Reactive Sputtering of Silicon and Transition Metal" which is a continuation-in-part of U.S. application Ser. No. 07/799,806, filed Nov. 29, 1991, by Finley et al. entitled "Multilayer Heat Processable Vacuum Coatings With Metallic Properties".

BACKGROUND

1. Field of the Invention

The present invention relates generally to the art of sputtering silicon-containing target materials in a reactive atmosphere, and more particularly to the art of fabricating cathode targets of silicon further comprising a transition metal.

2. Description of the Related Art

U.S. Pat. Nos. 4,990,234 and 5,170,291 to Szczyrbowski et al. disclose sputtering silica and silicides, such as nickel silicide ($NiSi_2$), in an oxidizing atmosphere to deposit dielectric oxide films.

SUMMARY OF THE INVENTION

The present invention involves cathode targets of silicon-metal alloys ranging from 3 to 18 weight percent of transition metal. Targets of silicon-metal alloys may be sputtered in an atmosphere comprising nitrogen, oxygen, inert gases and mixtures thereof to produce silicon-metal containing coatings including oxides, nitrides and oxynitrides. The silicon-metal cathode target compositions of the present invention comprise sufficient metal to provide target stability and a desirable sputtering rate while keeping the absorption of the resulting films relatively low.

DESCRIPTION OF THE PREFERRED EMBODIMENTS

In accordance with the present invention, silicon-nickel oxides, nitrides and oxynitrides are sputtered using D.C. magnetron sputtering. For this purpose, silicon-nickel cathode targets of the present invention are used for the sputtering targets. The sputtering rate is measured for varying amounts of nickel using pure nitrogen, nitrogen-oxygen or oxygen-argon mixtures as the sputtering gas. Optical properties are measured and compared.

The silicon-nickel cathode targets of the invention are found to sputter with less arcing and at higher rates than silicon-aluminum targets. However, when sputtering silicon-nickel with high nickel content, such as nickel silicide in nitrogen to form silicon-nickel nitride, the absorption is too high for certain applications. Since it is desirable in a production profess to use the same target material for many coating applications and vary the reactive gas to sputter different compositions, the nickel content in accordance with the present invention is kept low enough to limit absorption, particularly when sputtering the nitride compound, but high enough to give the desirable sputtering rate and target stability.

Silicon-nickel alloy cathode targets ranging between 3 and 18 weight percent nickel are sputtered in nitrogen-oxygen gas mixtures ranging from 0 to 40 percent oxygen. These nitrides and oxynitrides have low absorption, whereas alloys with a nickel content of 50 weight percent are found to be highly absorbing and consequently of limited utility in a commercial process.

The silicon-nickel cathode target compositions of the present invention are measured by sputtering the targets in argon and using X-ray compositions may also be determined by the DCP method where grindings fluorescence to determine the weight percent nickel. The cathode tar from the target surface are analyzed. These DCP values confirm the results obtained by X-ray fluorescence but are a bit higher in some cases due to variation in the target material.

Figure 1:
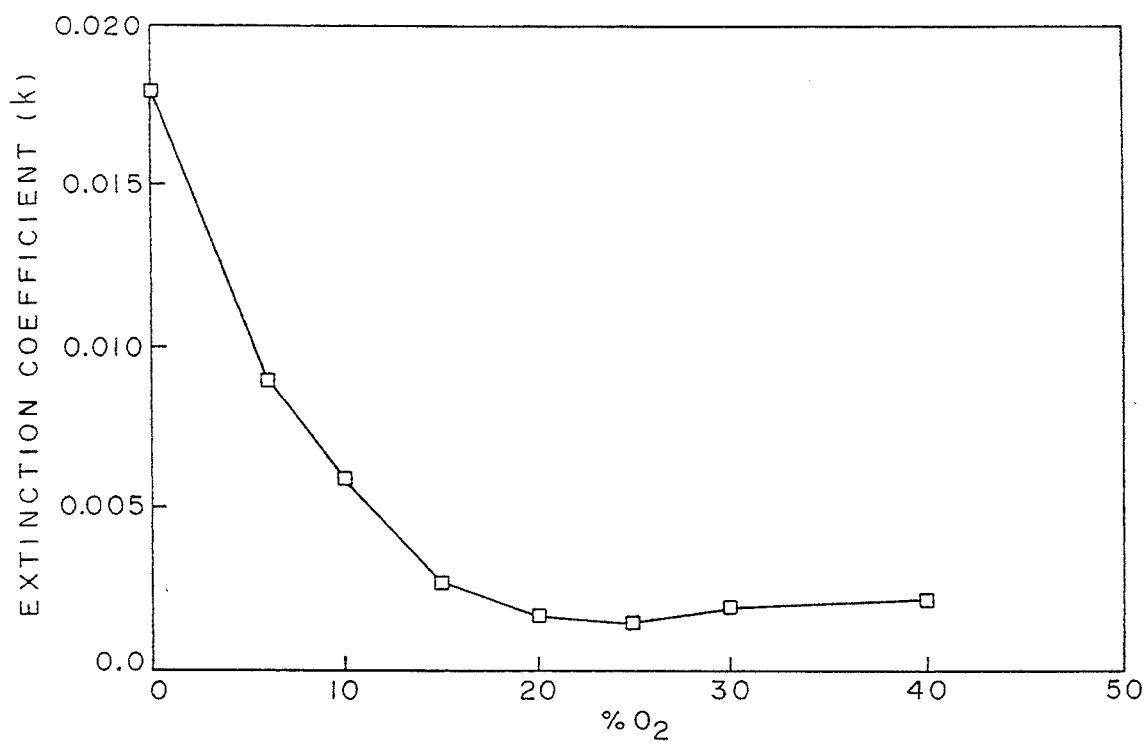
FIG. 1 illustrates the extinction coefficient (k) at 560 nanometers of films comprising Silicon and nickel, sputtered from a silicon target containing 10 weight percent nickel, as a function of the reactive gas composition over the range from 100 percent nitrogen to 60 percent nitrogen/40 percent oxygen, where the percent oxygen is based on the combined flows of oxygen and nitrogen in standard cubic centimeters per minute (sccm).
Figure 2:
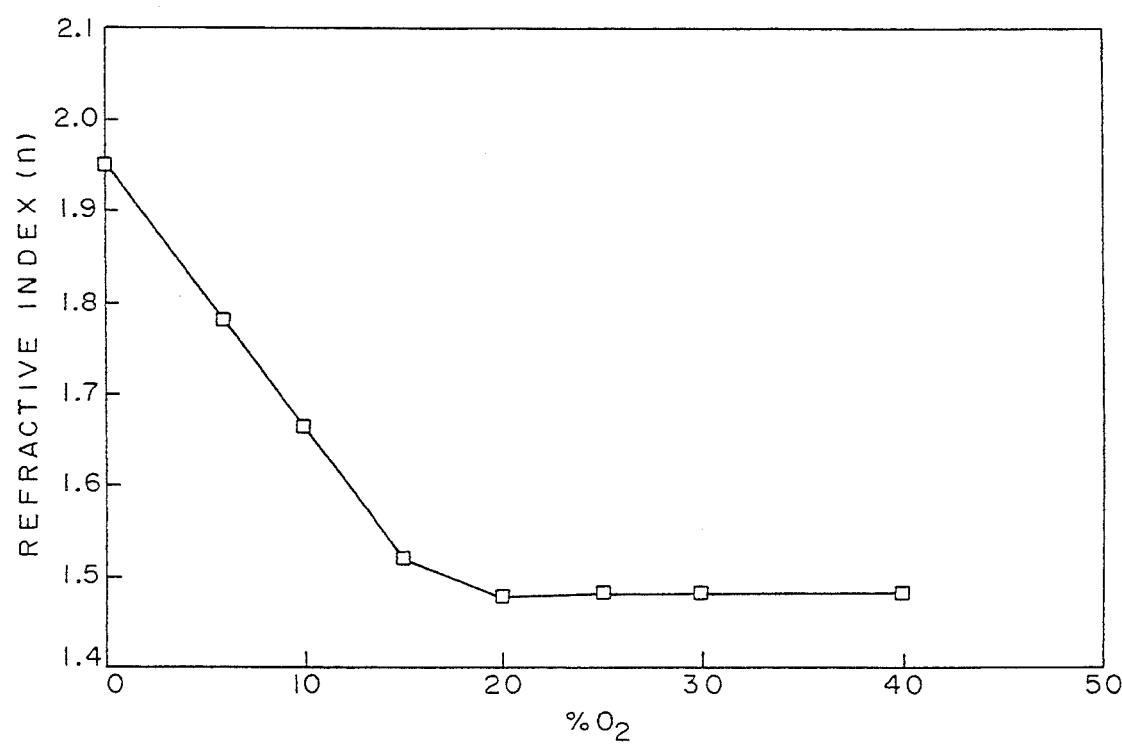
FIG. 2 illustrates the refractive index (n) at 560 nanometers of films comprising silicon and nickel, sputtered from a silicon target containing 10 weight percent nickel, as a function of the reactive gas composition over the range of from 100 percent nitrogen to 60 percent nitrogen/40 percent oxygen.

FIG. 1 illustrates that the absorption is low for oxide coatings deposited in oxygen-rich atmospheres, but there is a steep increase in absorption as the nitrogen flow rate increases and the nitride content of the coating increases. For compositions more than 19 weight percent nickel, the absorption increases more steeply. At 50 weight percent nickel, the absorption k is 0.3 (not shown) which is almost 10 times the absorption at 20 weight percent nickel. FIG. 2 illustrates a similar effect with respect to refractive index.

Figure 3:
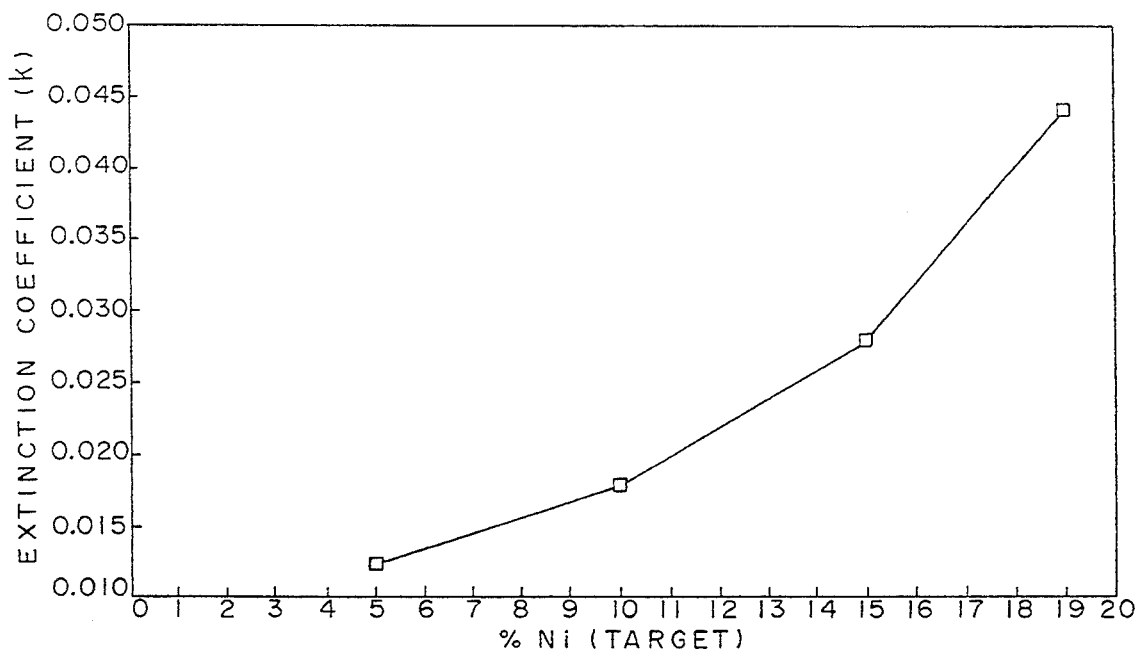
FIG. 3 illustrates the extinction coefficient (k) at 560 nanometers of films comprising silicon and nickel, sputtered in an atmosphere of 100 percent nitrogen, as a function of nickel content in the silicon target over the range of 5 to 19 weight percent nickel.
Figure 4:
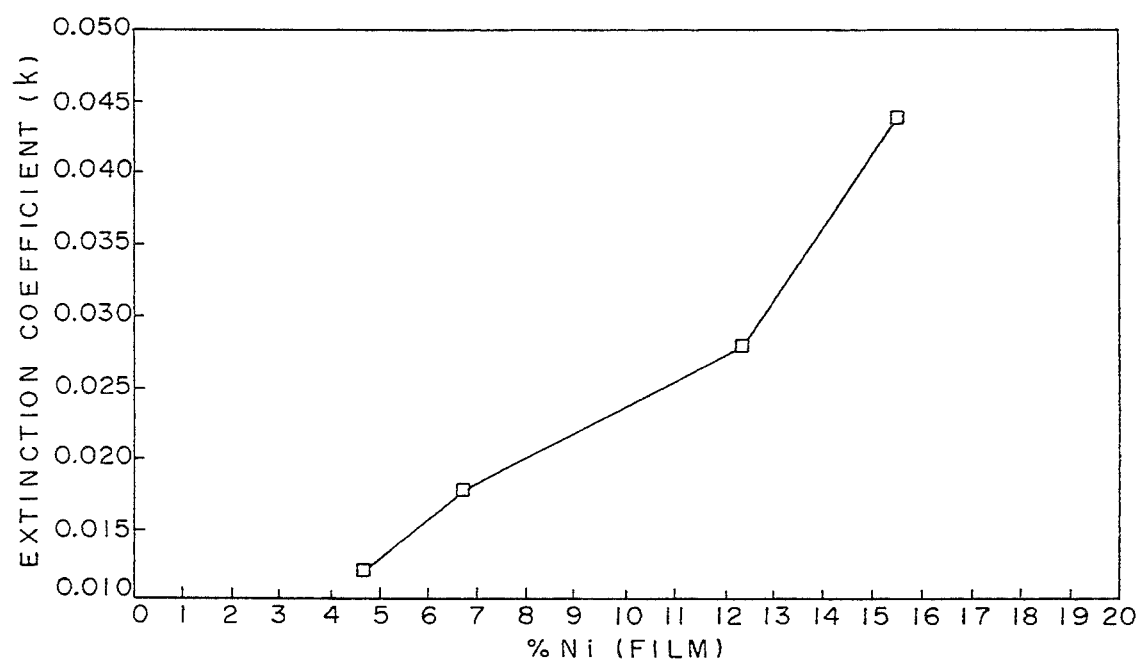
FIG. 4 illustrates the extinction coefficient (k) at 560 nanometers of films comprising silicon and nickel, sputtered in an atmosphere of 100 percent nitrogen, as a function of nickel content in the film, over the range of about 4.7 to 16 weight percent nickel.

FIGS. 3 and 4 illustrate absorption as a function of target and film compositions respectively. The absorption for a target or coating comprising 50 weight percent nickel (not shown) would be off this scale, which illustrates the effect of nickel content in the film, and why it is necessary to limit the nickel content because of the absorption Silicon-nickel alloy cathode targets of the present invention containing 3 to 18 weight percent nickel are useful, with nickel contents of 5 to 16 percent being preferred, especially in the range of 7 to 15 percent. The preferred method of fabricating a target with uniform distribution of nickel in silicon, no cracking, and minimum voids and inclusions, depends on the weight percent nickel the silicon target. For example, about fifteen weight percent nickel is a preferred composition when casting, while a lower weight percent nickel is preferred when growing a target from the melt, e.g. by the Czochralski method. In addition, targets can be produced either by spraying, e.g. plasma or thermal spraying, or powder metallurgy, e.g. by hot isostatic pressing of a mixture of silicon and nickel, or a silicon-nickel alloy. A lower nickel content in the silicon alloy cathode target composition is preferred to decrease the absorption, so long as sputtering stability and rates are not detrimentally affected. Most preferred are a silicon-nickel cathode target compositions of 3 to 10 weight percent nickel. Generally, the weight percent nickel in the film, based on the total combined weight of silicon and nickel in the film, is somewhat lower than the weight percent nickel in the target as measured by X-ray fluorescence and illustrated in FIG. 7.

Figure 5:
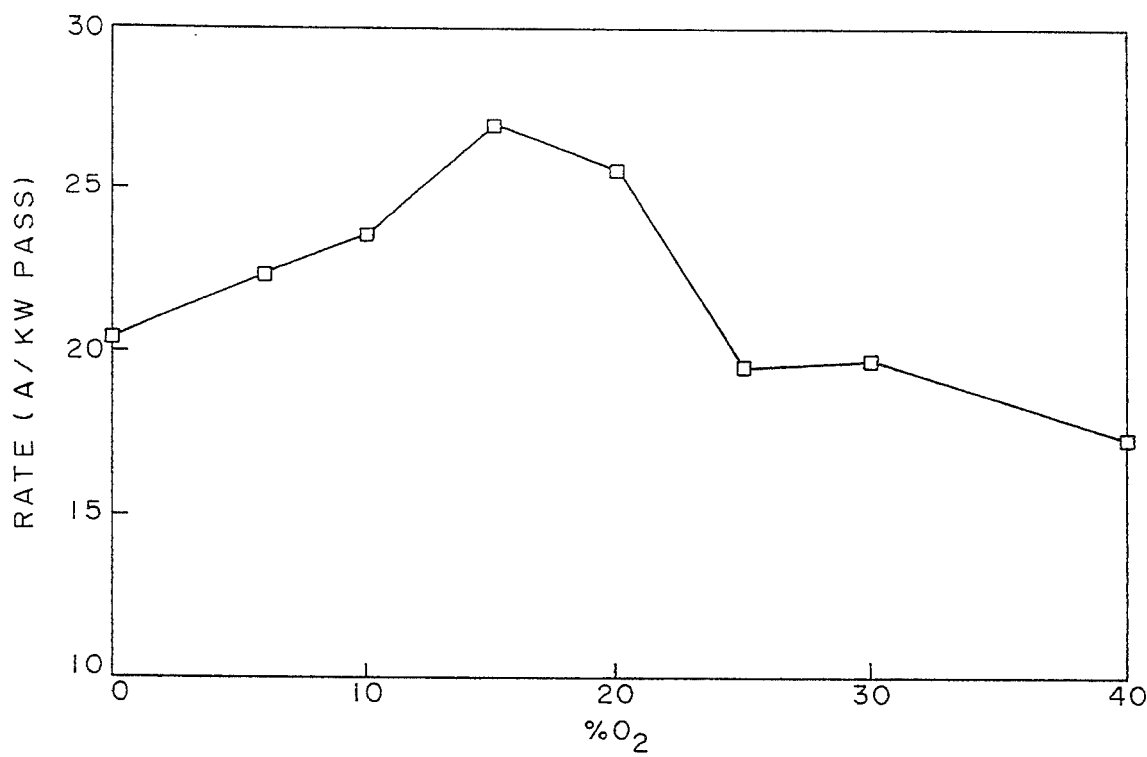
FIG. 5 illustrates the sputtering rate, in Angstroms per kilowatt-pass (Å/kw-pass) at a line speed of 120 inches per minute for films comprising silicon and nickel, sputtered from a silicon target containing 10 weight percent nickel, as a function of the reactive gas composition over the range of 100 percent nitrogen to 60 percent nitrogen/40 percent oxygen.

FIG. 5 illustrates the sputtering rate for the silicon-nickel alloy (10 weight percent nickel) used to produce films, the n and k of which are illustrated in FIGS. 1 and 2.

Figure 6:
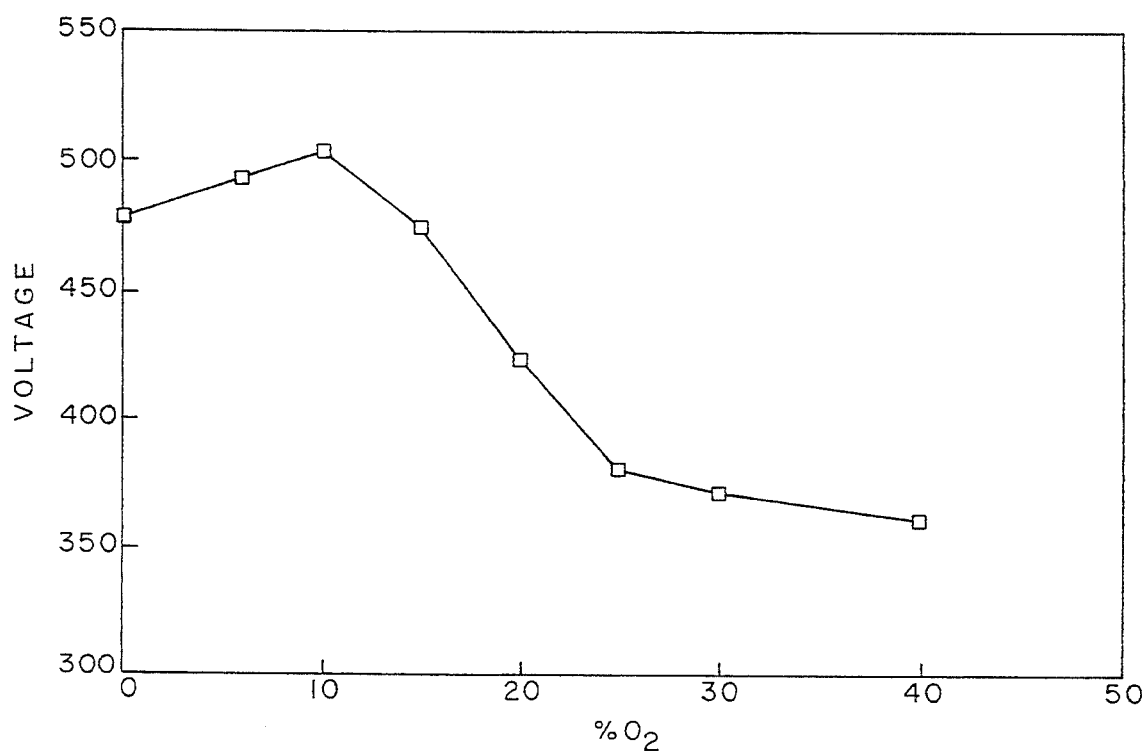
FIG. 6 illustrates the cathode voltage as a function of percent oxygen in an atmosphere comprising from 100 percent nitrogen to 60 percent nitrogen/40 percent oxygen for sputtering a silicon target containing 10 weight percent nickel at 3 kilowatts.
Figure 7:
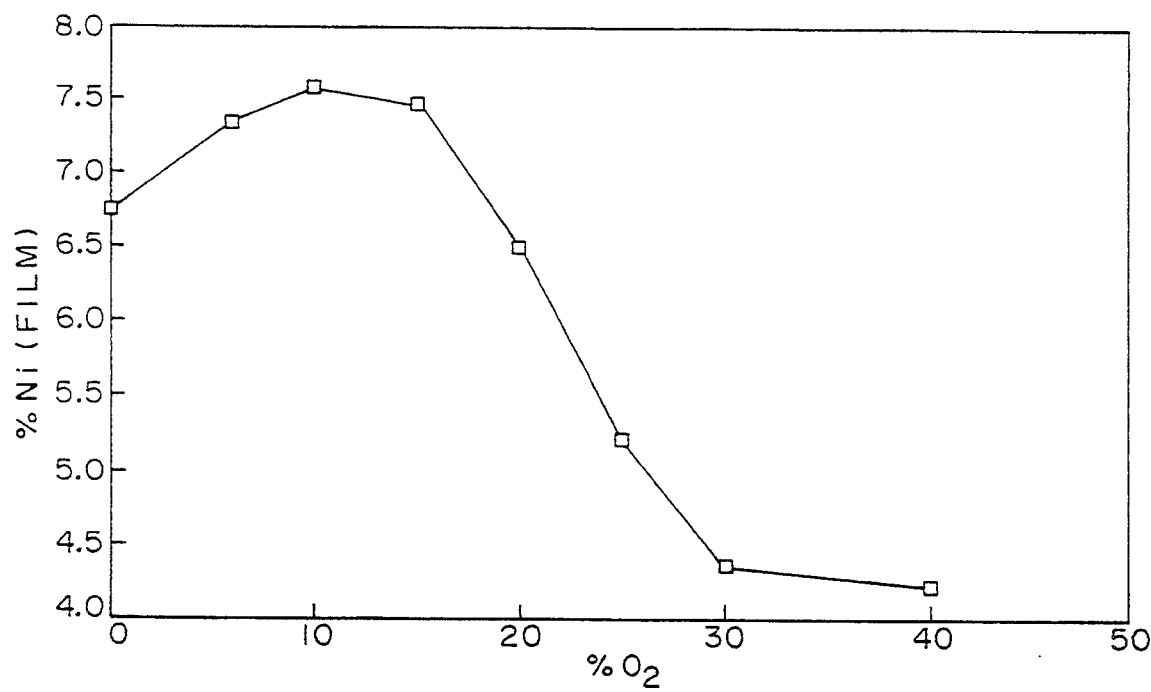
FIG. 7 illustrates the percent nickel in films comprising silicon and nickel, sputtered from a silicon target containing 10 weight percent nickel, as a function of the reactive gas composition over the range of 100 percent nitrogen to 60 percent nitrogen/40 percent oxygen.
Figure 8:
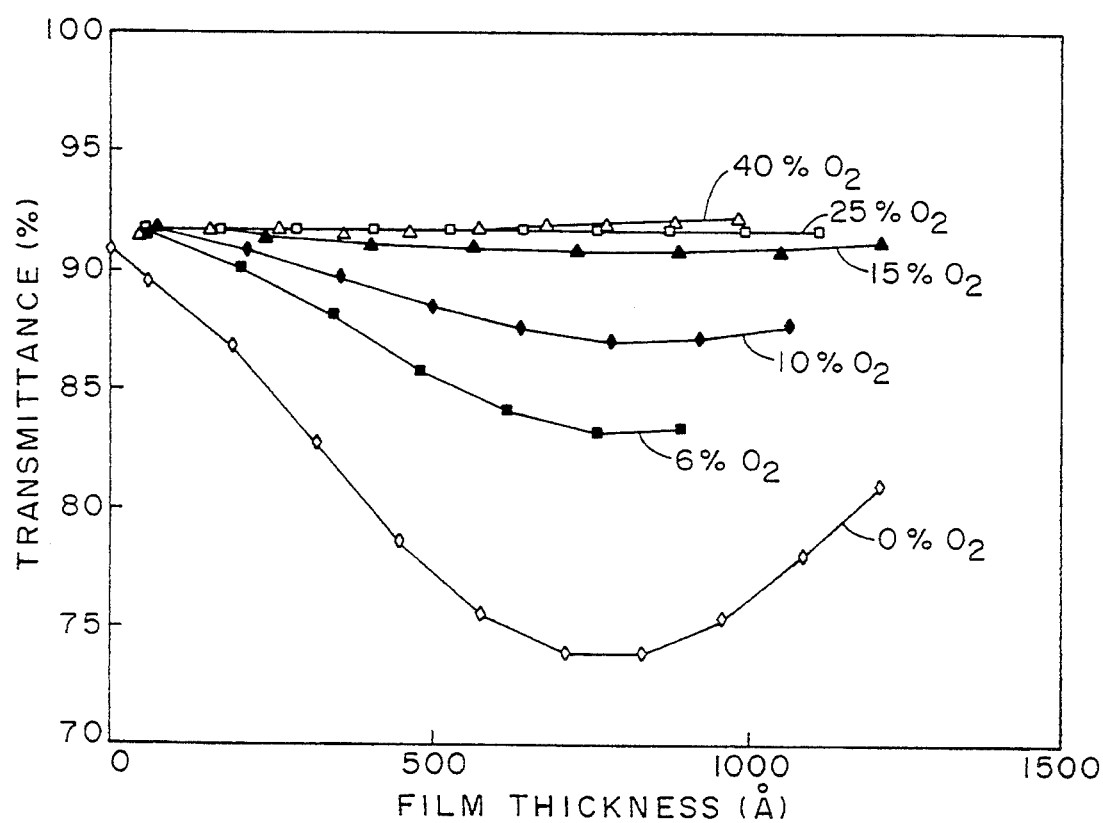
FIG. 8 illustrates the transmittance (%) at 550 nanometers as a function of film thickness for films sputtered from a silicon target containing 10 weight percent nickel in reactive gas atmospheres ranging from 100 percent nitrogen to percent nitrogen/40 percent oxygen.

The cathode voltage is a function of percent oxygen in the nitrogen-oxygen gas mixture is shown in FIG. 6 for 10 weight percent nickel targets. FIG. 7 shows the weight percent nickel in the sputtered film for the same range of nitrogen-oxygen gas mixtures. FIG. 8 shows the transmittance as a function of thickness of the coating. The curves represent transmittance for nitrogen and nitrogen-oxygen gas mixtures, and each point on the curve represents the first, third, etc. pass during deposition. The transmittance is monitored at 550 nanometers The sputtering rate increases as the oxygen flow rate increases, reaching a maximum rate between approximately 15 and 20 percent oxygen. FIG. 1 of extinction coefficient as a function of percent oxygen shows that for oxygen greater than 19%, the absorption for the films sputtered from the 10 percent nickel target is less than about 0.002. This indicates that maximum rate and low absorption are achieved for sputtering in a nitrogen-oxygen gas mixture of 20 to 30 percent oxygen. The refractive index shows a slight increase with nickel content in FIG. 2 in the same range. When sputtering in pure nitrogen, or a nitrogen-oxygen gas mixture of 20 percent or less oxygen, the absorption increases with nickel content. The curve shown in FIG. 3 illustrates the increase in extinction coefficient as the weight percent of nickel in the target is increased up to 19 weight percent. The same is shown in FIG. 4 for film composition.

In a preferred embodiment of the present invention, coatings are produced on a large-scale magnetron sputtering device capable of coating glass up to 100×144 inches (2.54×3.66 meters). In the following examples, the coatings are deposited on a smaller scale, using planar magnetron cathodes having 5×17 inch (12.7×43.2 centimeters) silicon-nickel targets. Base pressure is in the $10^{-6}$ Torr range. The coatings are made by first admitting the sputtering gas to a pressure of 4 millitorr and then setting the cathode at constant power of 3 kilowatts (kw). In each example, 6 millimeter thick glass substrates pass under the target on a conveyor roll at a speed of 120 inches (3.05 meters) per minute. The transmittance is monitored every other pass during the sputtering process at a wavelength of 550 nanometers using a Dyn-Optics 580D optical monitor.

After the coating is deposited, the transmittance and reflectance from both the glass and coated surface are measured in the wavelength range from 380 to 720 nanometers using a Pacific Scientific Spectrogard Color System spectro photometer. These data are used to calculate the coating refractive index n and absorption coefficient k shown in the figures for 560 nanometers. The thicknesses of the coatings are measured using Tencor P-1 Long Scan Profiler.

EXAMPLE 1

A sample is prepared using a silicon-nickel cathode target containing 10 weight percent nickel in a pure nitrogen gas atmosphere with a flow of 103 standard cubic centimeter per minute (sccm). The cathode voltage is 478 volts. The sputtered film deposited in this nitrogen gas is 6.7 weight percent nickel based on the total weight of silicon and nickel in the film. The transmittance of the coating, monitored at 550 nanometers, is 80.0 percent after 8 passes. The coating thickness is 490 Angstroms, and the sputtering rate is 20.4 Å/kw-pass. The index of refraction (n) is 2.0, and the extinction coefficient (k) is 0.0250 at 560 nanometers.

EXAMPLE 2

A sample is prepared using a silicon-nickel cathode target containing 10 weight percent nickel in a nitrogen-oxygen gas mixture with an oxygen flow of 6 sccm and a nitrogen flow of 99 sccm. The cathode voltage is 493 volts. The weight percent nickel in the sputtered film is 7.3 based on the combined weight of silicon and nickel in the film. The transmittance of the coating, monitored at 550 nanometers, is 83.9 percent after 14 passes. The coating thickness is 936 Angstroms, and the sputtering rate is 22.3 Å/kw-pass. The index of refraction (n) is 1.78, and the extinction coefficient (k) is 0.0089 at 560 nanometers.

EXAMPLE 3

A sample is prepared using a silicon-nickel cathode target containing 10 weight percent nickel in a nitrogen-oxygen gas mixture with an oxygen flow of 11 sccm and a nitrogen flow of 98 sccm. The cathode voltage is 503 volts. The weight percent nickel in the sputtered film is 7.6 based on the total weight of silicon and nickel in the film The transmittance of the coating, monitored at 550 nanometers, is 87.6 percent after 15 passes. The coating thickness is 1061 Angstroms, and the sputtering rate is 23.6 Å/kw-pass. The index of refraction (n) is 1.66, and the extinction coefficient (k) is 0.0059 at 560 nanometers.

EXAMPLE 4

A sample is prepared using a silicon-nickel cathode target containing 10 weight percent nickel in a nitrogen-oxygen gas mixture with an oxygen flow of 16 sccm and a nitrogen flow of 92 sccm. The cathode voltage is 474 volts. The weight percent nickel in the sputtered film is 7.5 based on the total weight of silicon and nickel in the film. The transmittance of the coating, monitored at 550 nanometers, is 91.3 percent after 15 passes. The coating thickness is 1213 Angstroms, and the sputtering rate is 27 Å/kw-pass. The index of refraction (n) is 1.52, and the extinction coefficient (k) is 0.0027 at 560 nanometers.

A sample is prepared using a silicon-nickel cathode target containing 10 weight percent nickel in a nitrogen-oxygen gas mixture with an oxygen flow of 21 sccm and a nitrogen flow of 84 sccm. The cathode voltage is 423 volts. The weight percent nickel in the sputtered film is 6.5 based on the total weight of silicon and nickel in the film. The transmittance of the coating, monitored at 550 nanometers, is 91.9 percent after 19 passes. The coating thickness is 1460 Angstroms, and the sputtering rate is 25.6 Å/kw-pass. The index of refraction (n) is 1.48, and the extinction coefficient (k) is 0.0017 at 560 nanometers.

EXAMPLE 6

A sample is prepared using a silicon-nickel cathode target containing 10 weight percent nickel in a nitrogen-oxygen gas mixture with an oxygen flow of 25 sccm and nitrogen flow of 75 sccm. The cathode voltage is 380 volts. The weight percent nickel in the sputtered film is 5.2 based on the combined weight of silicon and nickel in the film. The transmittance of the coating, monitored at 550 nanometers, is 92.3 percent after 19 passes. The coating thickness is 1111 Angstroms, and the sputtering rate is 19.5 Å/kw-pass. The index of refraction (n) is 1.48, and the extinction coefficient (k) is 0.0015 at 560 nanometers.

EXAMPLE 7

A sample is prepared using a silicon-nickel cathode target containing 10 weight percent nickel in a nitrogen-oxygen gas mixture with an oxygen flow of 30 sccm and nitrogen flow of 70 sccm. The cathode voltage is 371 volts. The weight percent nickel in the sputtered film is 4.4 based on the total weight silicon and nickel in the film. The transmittance of the coating, monitored at 550 nanometers, is 92.3 percent after 17 passes. The coating thickness is 1007 Angstroms, and the sputtering rate is 19.7 Å/kw-pass. The index of refraction (n) is 1.48, and the extinction coefficient (k) is 0.0020 at 560 nanometers.

EXAMPLE 8

A sample is prepared using a silicon-nickel cathode target containing 10 weight percent nickel in a nitrogen-oxygen gas mixture with an oxygen flow of 38 sccm and a nitrogen flow of 56 sccm. The cathode voltage is 360 volts. The weight percent nickel in the sputtered film is 4 2 based on the total weight of silicon and nickel in the film. The transmittance of the coating, monitored at 550 nanometers, is 92.3 percent after 19 passes. The coating thickness is 987 Angstroms, and the sputtering rate is 14.3 Å/kw-pass. The index of refraction (n) is 1.48, and the extinction coefficient (k) is 0.0022 at 560 nanometers.

EXAMPLE 9

A sample is prepared using a silicon-nickel cathode target containing 15 weight percent nickel in a pure nitrogen gas atmosphere with a flow of 106 sccm. The cathode voltage is 499 volts. The weight percent nickel in the sputtered film is 12.4 based on the total weight of silicon and nickel in the film. The transmittance of the coating, monitored at 550 nanometers, is 82.6 percent after 5 passes. The coating thickness is 297 Angstroms, and the sputtering rate is 19.8 Å/kw-pass. The index of refraction (n) is 1.99, and the extinction coefficient (k) is 0283 at 560 nanometers.

EXAMPLE 10

A sample is prepared using a silicon-nickel cathode target containing 19 weight percent nickel in a pure nitrogen gas atmosphere with a flow of 101 sccm. The cathode voltage is 487 volts. The weight percent nickel in the sputtered film is 15.6 based on the combined weight of silicon and nickel in the film. The transmittance of the coating, monitored at 550 nanometers, is 2.8 percent after 8 passes. The coating thickness is 496 Angstroms, and the sputtering rate is 20.7 Å/kw-pass. The index of refraction (n) is 2.04, and the extinction coefficient (k) is 0.0443 at 560 nanometers.

EXAMPLE 11

A sample is prepared using a silicon-nickel cathode target containing 15 weight percent nickel in an oxygen-argon gas mixture with an oxygen flow of 55 sccm and an argon flow of 55 sccm. The cathode voltage is 325 volts. The weight percent nickel in the sputtered film is 5.8 based on the total weight of silicon and nickel. The transmittance of the coating, monitored at 55 nanometers, is 91.6 percent after 12 passes. The coating thickness is 703 Angstroms, and the sputtering rate is 19.5 Å/kw-pass. The index of refraction (n) is 1.48, and the extinction coefficient (k) is 0.0007 at 560 nanometers.

EXAMPLE 12

A sample is prepared using a silicon-nickel cathode target containing 5 weight percent nickel in a pure nitrogen gas atmosphere with a flow of 99 sccm. The cathode voltage is 547 volts. The weight percent nickel in the sputtered film is 4.7 based on the total weight of silicon and nickel in the film. The transmittance of the coating, monitored at 550 nanometers, is 76.6 percent after 11 passes. The coating thickness is 548 Angstroms, and the sputtering rate is 16.6 Å/kw-pass. The index of refraction (n) is 1.98, and the extinction coefficient (k) is 0.0123 at 560 nanometers.

EXAMPLE 3

A coating comprising silicon nickel nitride is prepared by employing a commercial coater using all planar magnetron cathodes. Solargray ® glass of thickness 4.0 mm is coated in block sizes of 23×42 inches (0.58×1.1 meters) and 22×59 inches (0.56×1.5 meters) arranged in a covey of either 84×144 inches (2.1×3.7 meters) or 100×144 inches (2.5×3.7 meters) The glass is sputter coated first by sputtering a titanium cathode target in inert argon atmosphere, then sputtering a titanium cathode target in nitrogen atmosphere, then sputtering a silicon-nickel cathode target containing 15 weight percent nickel in nitrogen to form a coated glass article wherein the coating comprises titanium/titanium nitride/silicon-nickel nitride. The coated glass may be washed, cut, edged, screen printed with a black band and tempered for use as an automotive transparency for privacy glazing. The coating thicknesses for the individual layers are in the range of 25 Angstroms titanium, 430 Angstroms titanium nitride and 300 Angstroms silicon-nickel nitride. Typical optical properties of these coated glass articles before and after heating are the following:

|  | UNHEATED | HEATED |
|---|---|---|
| Film Side |  |  |
| Y | 12.8 | 10.2 |
| x | .369 | .330 |
| y | .389 | .355 |
| TSER | 24.5 | 25.4 |
| Glass side |  |  |
| Y | 13.0 | 10.7 |
| x | .310 | .298 |
| y | .335 | .323 |
| TSER | 14.0 | 13.0 |
| Transmittance |  |  |
| LTA | 14.8 | 20.0 |
| TSET | 10.7 | 13.0 |

The color and reflectance are measured on a Spectrogard Color System spectrophotometer.

The above examples wire prepared using silicon-nickel cathode targets sputtered in pure nitrogen, in nitrogen-oxygen gas mixtures ranging from up to 40 percent oxygen, and in an argon-oxygen mixture comprising 50 percent oxygen. Based on the data illustrated in the figures, a single silicon-nickel cathode target containing a low weight percentage of nickel can be used for stable sputtering of a range of film compositions including oxides, nitrides and oxynitrides with low absorption at high sputtering rates. The above examples illustrate the concept of the present invention, the scope of which is defined by the following claims.

What is claimed is:

1. A cathode target comprising:
   a. silicon; and
   b. 3 to 18 weight percent nickel based on the total weight of silicon and nickel.

2. A method for depositing coatings comprising silicon and nickel comprising the steps of:
   a. maintaining a nonmetallic substrate in an evacuated chamber;
   b. maintaining an atmosphere comprising a gas selected from the group consisting of nitrogen, oxygen, inert gases, and mixtures thereof; and
   c. sputtering a cathode target comprising silicon and 3 to 18 weight percent nickel based on the total weight of silicon and nickel to deposit a coating on a surface of the substrate.

3. A method according to claim 2, wherein the substrate is glass.

4. A method according to claim 3, wherein the atmosphere consists essentially of inert gas, and the coating consists essentially of silicon and 3 to 18 weight percent nickel based on the total weight of silicon and nickel.

5. A cathode target comprising:
   a. at least 82 weight percent silicon; and
   b. from 3 to 18 weight percent nickel.

6. A cathode target according to claim 5, wherein the weight percent nickel is from 5 to 16 percent.

7. A cathode target according to claim 6, wherein the weight percent nickel is from 7 to 15 percent.

8. A method for depositing coatings comprising silicon and nickel comprising the steps of:
   a. maintaining a nonmetallic substrate in an evacuated chamber;
   b. maintaining an atmosphere comprising a gas selected from the group consisting of nitrogen, oxygen, inert gases, and mixtures thereof; and
   c. sputtering a cathode target comprising at least 82 weight percent silicon and from 3 to 18 weight percent nickel based on the total weight of silicon and nickel to deposit a coating on a surface of the substrate.

9. A method according to claim 8, wherein the coating consists of 5 to 16 weight percent nickel.

10. A method according to claim 9, wherein the coating consists of 7 to 15 weight percent nickel.

11. A method according to claim 8, wherein the atmosphere comprises nitrogen, and the coating comprises silicon-nickel nitride.

12. A method according to claim 8, wherein the atmosphere comprises nitrogen and oxygen, and the coating comprises silicon-nickel oxynitride.

* * * * *

UNITED STATES PATENT AND TRADEMARK OFFICE
CERTIFICATE OF CORRECTION

PATENT NO. : 5,417,827
DATED : May 23, 1995
INVENTOR(S) : James J. Finley

It is certified that error appears in the above-indentified patent and that said Letters Patent is hereby corrected as shown below:

Column 8, claim 2, line 5, after "maintaining", insert --in said chamber--.

Column 8, claim 2, line 8, after "sputtering", insert --in said chamber--.

Column 8, claim 8, line 5, after "maintaining", insert --in said chamber--.

Column 8, claim 8, line 8, after "sputtering", insert --in said chamber--.

Signed and Sealed this

Second Day of July, 1996

Attest:

BRUCE LEHMAN

*Attesting Officer*     *Commissioner of Patents and Trademarks*